(12) United States Patent
Nagatomo (10) Patent No.: US 10,273,190 B2
(45) Date of Patent: Apr. 30, 2019

(54) FOCUS RING AND METHOD FOR PRODUCING FOCUS RING

(71) Applicant: SUMITOMO OSAKA CEMENT CO., LTD., Tokyo (JP)

(72) Inventor: Hiroaki Nagatomo, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/742,421

(22) PCT Filed: Aug. 23, 2016

(86) PCT No.: PCT/JP2016/074491
§ 371 (c)(1),
(2) Date: Jan. 5, 2018

(87) PCT Pub. No.: WO2017/038555
PCT Pub. Date: Mar. 9, 2017

(65) Prior Publication Data
US 2018/0201545 A1    Jul. 19, 2018

(30) Foreign Application Priority Data

Sep. 3, 2015   (JP) ................................ 2015-174166
Jan. 27, 2016  (JP) ................................ 2016-013849

(51) Int. Cl.
*H01B 1/04*       (2006.01)
*H01L 21/3065*    (2006.01)
(Continued)

(52) U.S. Cl.
CPC ........ *C04B 35/565* (2013.01); *C04B 35/5755* (2013.01); *C04B 35/645* (2013.01);
(Continued)

(58) Field of Classification Search
CPC ... H01B 1/04; H01L 21/3065; H01L 32/6833; H01J 37/32642; C04B 35/565
See application file for complete search history.

(56) References Cited

U.S. PATENT DOCUMENTS

| 5,904,778 A  * | 5/1999 | Lu ..................... H01J 37/32467 118/723 R |
| 6,936,102 B1 * | 8/2005 | Otsuki .................. C23C 16/325 117/101 |
| 2009/0151870 A1* | 6/2009 | Urakawa .......... H01J 37/32623 156/345.1 |

FOREIGN PATENT DOCUMENTS

| JP | 06-029223 A   | 2/1994 |
| JP | 2001-019549 A | 1/2001 |

(Continued)

OTHER PUBLICATIONS

JP 2001-019549 (pub Jan. 2001) machine English language translation.*

(Continued)

*Primary Examiner* — Mark Kopec
(74) *Attorney, Agent, or Firm* — Merchant & Gould P.C.

(57) ABSTRACT

The present invention provides a focus ring having favorable plasma resistance. In addition, the present invention provides a method for producing a focus ring which enables the easy production of focus rings having favorable plasma resistance. The focus ring of the present invention is a focus ring made of a sintered body of silicon carbide, in which the sintered body includes a plurality of first crystal grains having an α-SiC-type crystal structure and a plurality of second crystal grains having a β-SiC-type crystal structure, a content of the first crystal grains is 70% by volume or more of a total of the first crystal grains and the second crystal (Continued)

grains, and a volume-average crystallite diameter of the first crystal grains is 10 μm or less.

10 Claims, 1 Drawing Sheet

(51) Int. Cl.
    *C04B 35/565*     (2006.01)
    *C04B 35/645*     (2006.01)
    *H01L 21/683*     (2006.01)
    *C04B 35/575*     (2006.01)
    *H01J 37/32*     (2006.01)

(52) U.S. Cl.
    CPC ........... *H01B 1/04* (2013.01); *H01L 21/3065* (2013.01); *H01L 21/6833* (2013.01); *C04B 2235/383* (2013.01); *C04B 2235/3834* (2013.01); *C04B 2235/5436* (2013.01); *C04B 2235/5445* (2013.01); *C04B 2235/5454* (2013.01); *C04B 2235/5472* (2013.01); *C04B 2235/6562* (2013.01); *C04B 2235/72* (2013.01); *C04B 2235/786* (2013.01); *C04B 2235/94* (2013.01); *H01J 37/32642* (2013.01)

(56) References Cited

FOREIGN PATENT DOCUMENTS

JP     2002-037669 A     2/2002
JP     2006-240896 A     9/2006

OTHER PUBLICATIONS

JP 06-029223 (pub Feb. 1994) machine English language translation.*
International Search Report for PCT/JP2016/074491 (dated Oct. 4, 2016).

\* cited by examiner

FOCUS RING AND METHOD FOR PRODUCING FOCUS RING

This application is a National Stage Application under 35 U.S.C. § 371 of International Application No. PCT/JP2016/074491 filed Aug. 23, 2016, which claims the benefit of priority to Japanese Patent Application No. 2015-174166 filed Sep. 3, 2015 and Japanese Patent Application No. 2016-013849 filed on Jan. 27, 2016, the disclosures of all of which are hereby incorporated by reference in their entireties. The International Application was published in Japanese on Mar. 9, 2017 as WO 2017/038555.

TECHNICAL FIELD

The present invention relates to a focus ring and a method for producing a focus ring.

BACKGROUND ART

Recently, in semiconductor production apparatuses in which plasma steps are carried out, electrostatic chuck devices capable of easily mounting and fixing wafers on and to a sample platform and capable of maintaining the wafers at desired temperatures have been used. These electrostatic chuck devices include, in the upper portion, a ring member which surrounds a wafer-loading surface and is disposed at an outer circumferential edge portion of a wafer adsorption portion (focus ring).

In a state in which a wafer is placed in an electrostatic chuck device, the focus ring is disposed so as to surround the outer circumference of the wafer in a plan view. Therefore, when a forming material of the focus ring is selected, in the circumferential edge portion of the wafer, it is possible to form an electrical environment for plasma which is substantially the same as that in the wafer, and it is possible to prevent differences or bias of plasma treatments from being easily caused between the central portion and the circumferential edge portion of the wafer. For focus rings of the related art, as forming materials having a similar electrical conductivity to those of wafers which are process subjects, the same substance as wafers are frequently used. For example, in electrostatic chuck devices for processing silicon wafers, silicon focus rings are used.

However, when silicon wafers are processed in plasma steps in which chlorine-based plasma is used, silicon focus rings as described above are consumed at the same time. As a result, high frequency permeability near focus rings changes or thermal conduction properties change. Furthermore, there has been a problem in that, due to changes in the shapes of focus rings caused by heat and consumption, changes in the thermal conductivities of focus rings and focus ring-loading surfaces cause temperature changes of focus rings, and the treatment conditions of plasma steps become unstable.

Therefore, in recent years, focus rings made of silicon carbide which is a forming material that is not easily consumed by plasma have been proposed (for example, refer to Patent Literature No. 1).

CITATION LIST

Patent Literature

[Patent Literature No. 1] Japanese Laid-open Patent Publication No. 2002-37669

SUMMARY OF INVENTION

Technical Problem

In the invention described in Patent Literature No. 1, a silicon carbide bulk material produced using a chemical vapor deposition (CVD) method is processed and molded, thereby obtaining a focus ring. However, in order to form thick members such as focus rings using the CVD method, large bulk materials are required, and the costs are likely to rise.

In addition, in Patent Literature No. 1, silicon carbide containing silicon carbide of 3C-type (zinc blend-type) crystals as the main body (hereinafter, β-SiC) is used. In plasma steps for which electrostatic chuck devices are used, a variety of plasmas are used, but β-SiC focus rings are weak to plasma for which fluorine-based gas and oxygen gas, which are used to remove oxidized films of silicon wafers, are used as raw material gases. Therefore, β-SiC focus rings still have a problem of being consumed in plasma steps, and there has been a demand for improvement.

The present invention has been made in consideration of the above-described circumstances, and an object of the present invention is to provide a focus ring having favorable plasma resistance. In addition, another object of the present invention is to provide a method for producing a focus ring which enables the easy production of focus rings having favorable plasma resistance.

Solution to Problem

In order to achieve the above-described objects, an aspect of the present invention provides a focus ring including a sintered body of silicon carbide, the sintered body including a plurality of first crystal grains having an α-SiC-type crystal structure and a plurality of second crystal grains having a β-SiC-type crystal structure, in which a content of the first crystal grains is 70% by volume or more of a total of the first crystal grains and the second crystal grains, and a volume-average crystallite diameter of the first crystal grains is 10 µm or less.

In the aspect of the present invention, a volume-average crystallite diameter of the second crystal grains may be smaller than the volume-average crystallite diameter of the first crystal grains.

In the aspect of the present invention, an average volume intrinsic resistance of the sintered body may be 0.1 Ω·cm or more and 100 Ω·cm or less.

In the aspect of the present invention, a thermal conductivity may be 100 W/mK or more, and thermal conductivities in a circumferential direction and in a radial direction may be greater than a thermal conductivity in a thickness direction.

In the aspect of the present invention, a relative density of the sintered body may be 95% or more.

In the aspect of the present invention, a ratio of a mass of impurities to a mass of the entire focus ring may be 500 ppm or less.

Another aspect of the present invention provides a method for producing a focus ring, the method including a step of mixing first particles which have an α-SiC-type crystal structure and an average particle diameter of 5 µm or less and second particles which have a β-SiC-type crystal structure and an average particle diameter of 0.1 µm or less so that a content of the first particles reaches 70% by volume or more of a total of the first particles and the second particles and a step of sintering a mixture including mixed particles of the first particles and the second particles using a hot press, in which, in the step of sintering, the mixture is heated and pressurized at 2,200° C. or higher and 2,500° C. or lower and 20 MPa or more and 50 MPa or less, and a heating temperature-rise rate from 1,400° C. to 2,000° C. is 10° C./minute or more and 30° C./minute or less.

In the aspect of the present invention, the production method may include, prior to the step of mixing, a step of synthesizing the second particles using a thermal plasma CVD method.

In the production method of the aspect of the present invention, in the step of mixing, the first particles and the second particles may be respectively sprayed at a high speed and caused to collide with each other.

In the production method of the aspect of the present invention, in the step of mixing, a compound including impurity elements which are elements other than silicon and carbon may be further mixed thereinto, and a ratio of a mass of the impurity elements to a mass of the entire mixed particles may be 500 ppm or less.

Advantageous Effects of Invention

According to the present invention, it is possible to provide a focus ring having favorable plasma resistance. In addition, it is possible to provide a method for producing a focus ring which enables the easy production of focus rings having favorable plasma resistance.

DESCRIPTION OF EMBODIMENTS

Figure 1:
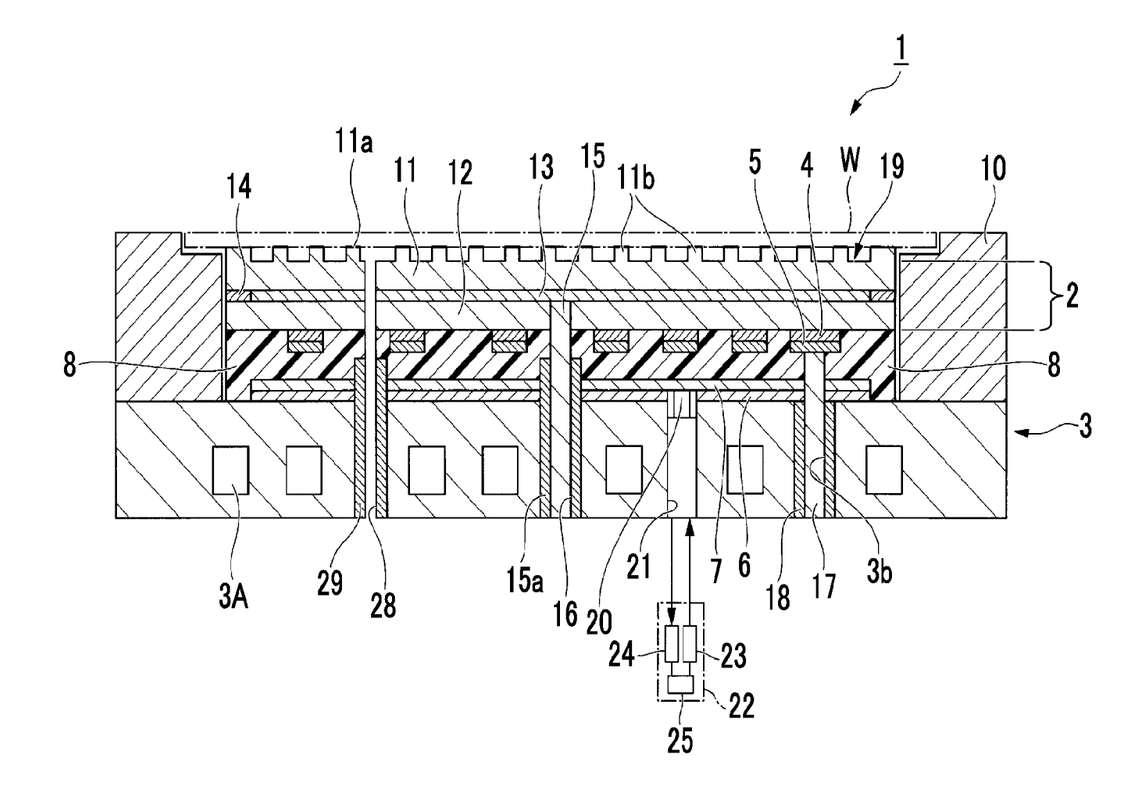
The Drawing is a cross-sectional view illustrating an electrostatic chuck device including a focus ring of an embodiment.

Hereinafter, a focus ring according to the present embodiment will be described with reference to the Drawing. Meanwhile, in the following drawing, the dimensions, ratios, and the like of individual constituent elements are appropriately varied in order to make the drawing look simple.

[Electrostatic Chuck Device]

The Drawing is a cross-sectional view illustrating an electrostatic chuck device including the focus ring of the present embodiment. An electrostatic chuck device 1 of the present embodiment includes an electrostatic chuck portion 2 which has a loading surface on one main surface (upper surface) side and has a disc shape in a plan view, a base portion for temperature adjustment 3 which is provided below the electrostatic chuck portion 2, is thick enough to adjust the electrostatic chuck portion 2 to a desired temperature, and has a disc shape in a plan view, and a focus ring 10 provided in a circular shape which is concentric with the disc-shaped electrostatic chuck portion 2. In addition, the electrostatic chuck portion 2 and the base portion for temperature adjustment 3 are adhered to each other through an adhesive layer 8 provided between the electrostatic chuck portion 2 and the base portion for temperature adjustment 3.

Here, individual constitutions of the electrostatic chuck device including the focus ring of the present embodiment will be sequentially described.

(Electrostatic Chuck Portion)

The electrostatic chuck portion 2 has a loading plate 11 having a loading surface 11a on which a plate-shaped sample W such as a semiconductor wafer is loaded on the upper surface, a supporting plate 12 which is integrated with the loading plate 11 and supports the bottom portion side of the loading plate 11, an electrode for electrostatic adsorption (internal electrode for electrostatic adsorption) 13 provided between the loading plate 11 and the supporting plate 12, and an insulating material layer 14 which insulates the circumference of the electrode for electrostatic adsorption 13.

The loading plate 11 and the supporting plate 12 are disc-shaped members having the same shape in the overlapped surfaces. The loading plate 11 and the supporting plate 12 are constituted of a sintered body such as an aluminum oxide-silicon carbide ($Al_2O_3$—SiC) composite sintered body, aluminum oxide ($Al_2O_3$) sintered body, an aluminum nitride (AlN) sintered body, or a yttrium oxide ($Y_2O_3$) sintered body and are insulating ceramic sintered bodies having a mechanical strength and durability to corrosive gas and plasma thereof.

On the loading surface 11a of the loading plate 11, a plurality of protrusion portions 11b having a diameter that is smaller than the thickness of the plate-shaped sample is formed at predetermined intervals, and these protrusion portions 11b support the plate-shaped sample W.

The thickness of the electrostatic chuck portion 2 including the loading plate 11, the supporting plate 12, the electrode for electrostatic adsorption 13, and the insulating material layer 14 is, for example, 0.7 mm or more and 5.0 mm or less.

For example, when the thickness of the entire electrostatic chuck portion 2 is less than 0.7 mm, it becomes difficult to ensure the mechanical strength of the electrostatic chuck portion 2. When the thickness of the entire electrostatic chuck portion 2 is more than 5.0 mm, the thermal capacity of the electrostatic chuck portion 2 increases, the thermal responsiveness of the plate-shaped sample W to be loaded deteriorates, and the thermal conduction of the electrostatic chuck portion in the traverse direction increases. Therefore, it becomes difficult to maintain the in-plane temperature of the plate-shaped sample W in a desired temperature pattern. Meanwhile, the thicknesses of the respective portions described herein are simply examples and do not limit the thickness of the entire electrostatic chuck portion of the present invention to the above-described range.

The electrode for electrostatic adsorption 13 is used as an electrode for electrostatic chuck for generating charges and fixing the plate-shaped sample W to the loading surface 11a of the loading plate 11 with an electrostatic adsorption force thereof, and the shape and size thereof are appropriately adjusted depending on applications thereof.

The electrode for electrostatic adsorption 13 is preferably formed of conductive ceramic such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body or high-melting-point metal such as tungsten (W), tantalum (Ta), or molybdenum (Mo).

The thickness of the electrode for electrostatic adsorption 13 is not particularly limited, can be set to, for example, a thickness of 0.1 μm or more and 100 μm or less, and is preferably set to a thickness of 5 μm or more and 20 μm or less.

When the thickness of the electrode for electrostatic adsorption 13 is less than 0.1 μm, it becomes difficult to ensure sufficient electrical conduction properties. When the thickness of the electrode for electrostatic adsorption 13 is more than 100 μm, cracks are likely to be generated in the joint interfaces between the electrode for electrostatic adsorption 13 and the loading plate 11 and between the electrode for electrostatic adsorption 13 and the supporting plate 12 due to the thermal expansion coefficient differences between the electrode for electrostatic adsorption 13 and the loading plate 11 and between the electrode for electrostatic adsorption 13 and the supporting plate 12.

The electrode for electrostatic adsorption 13 having the above-described thickness can be easily formed using a film-forming method such as a sputtering method or a deposition method or a coating method such as a screen printing method.

The insulating material layer 14 is a member which surrounds the outer circumference of the electrode for electrostatic adsorption 13 so as to protect the electrode for electrostatic adsorption 13 from corrosive gas and plasma thereof and joins and integrates the boundary portions with the loading plate 11 and the supporting plate 12, that is, outer circumferential portion regions other than the electrode for electrostatic adsorption 13, and is constituted of an insulating material having the same composition or the same main component as that of the material constituting the loading plate 11 and the supporting plate 12.

(Base Portion for Temperature Adjustment)

The base portion for temperature adjustment 3 is a member for adjusting the electrostatic chuck portion 2 to a desired temperature and is a thick disc-shaped member. As the base portion for temperature adjustment 3, for example, a liquid-cooled base or the like having flow paths 3A, through which cooling media are circulated, formed therein is preferred.

The material constituting the base portion for temperature adjustment 3 is not particularly limited as long as the material is metal that is excellent in terms of thermal conduction properties, electrical conduction properties, and workability or a compound material including the above-described metal. For example, aluminum (Al), aluminum alloys, copper (Cu), copper alloys, stainless steel (SUS), and the like are preferably used. On at least a surface of the base portion for temperature adjustment 3 which is exposed to plasma, it is preferable to carry out an alumite treatment or form an insulating film of alumina or the like.

To the upper surface side of the base portion for temperature adjustment 3, an insulating plate 7 is adhered through an adhesive layer 6. As the adhesive layer 6, it is possible to use a layer made of a sheet-shaped or film-shaped adhesive resin having thermal resistance and insulating properties such as a polyimide resin, a silicon resin, or an epoxy resin. The adhesive layer is formed to a thickness of, for example, approximately 5 to 100 μm. As the insulating plate 7, it is possible to use a plate made of a thin plate, sheet, or film of a resin having thermal resistance such as a polyimide resin, an epoxy resin, or an acrylic resin.

Meanwhile, the insulating plate 7 may be, instead of a resin sheet, an insulating ceramic plate or a sprayed film having insulating properties of alumina or the like.

(Focus Ring)

The focus ring 10 is a member which is loaded in the circumferential edge portion of the upper surface of the base portion for temperature adjustment 3 and has a circular shape in a plan view and is the focus ring according to the present invention. The focus ring 10 includes a silicon carbide sintered body. The focus ring 10 will be described below in detail.

(Other Members)

To the electrode for electrostatic adsorption 13, a terminal for power feeding 15 for applying direct-current voltages to the electrode for electrostatic adsorption 13 is connected. The terminal for power feeding 15 is inserted into the inside of a through-hole 16 which penetrates the base portion for temperature adjustment 3, the adhesive layer 8, and the supporting plate 12 in the thickness direction. An insulator 15a having insulating properties is provided on the outer circumferential side of the terminal for power feeding 15, and the terminal for power feeding 15 is insulated from the metal base portion for temperature adjustment 3 through the insulator 15a.

The Drawing illustrates the terminal for power feeding 15 as an integral member, but the terminal for power feeding 15 may be constituted by electrically connecting a plurality of members. The terminal for power feeding 15 is inserted between the base portion for temperature adjustment 3 and the supporting plate 12 having mutually different thermal expansion coefficients, and thus, for example, a portion that is inserted between the base portion for temperature adjustment 3 and the supporting plate 12 can be constituted using mutually different materials.

In the terminal for power feeding 15, the material of a portion which is connected to the electrode for electrostatic adsorption 13 and is inserted into (extraction electrode) the supporting plate 12 is not particularly limited as long as the material is a conductive material having excellent thermal resistance, but materials having a thermal expansion coefficient that is similar to the thermal expansion coefficients of the electrode for electrostatic adsorption 13 and the supporting plate 12 are preferred. Examples thereof include conductive ceramic materials such as $Al_2O_3$—TaC.

In the terminal for power feeding 15, a portion which is inserted into the base portion for temperature adjustment 3 can be constituted of, for example, a metallic material such as tungsten (W), tantalum (Ta), molybdenum (Mo), niobium (Nb), or a Kovar alloy.

These two members can be connected to each other using a silicon-based conductive adhesive having flexibility and electrical resistance.

On the lower surface side of the electrostatic chuck portion 2, heater elements 5 are provided. The heater element 5 is, for example, a non-magnetic metal thin plate having a constant thickness that is 0.2 mm or less and preferably approximately 0.1 mm. This non-magnetic metal thin plate can be obtained by, for example, processing a titanium (Ti) thin plate, a tungsten (W) thin plate, a molybdenum (Mo) thin plate, or the like to a desired heater shape using a photolithography method or laser processing. Regarding the shape, for example, it is possible to set the entire contour of a shape obtained by meandering a strip-shaped conductive thin plate to a circular shape.

The above-described heater elements 5 may be provided by adhering a non-magnetic metal thin plate to the electrostatic chuck portion 2 and then processing and molding the non-magnetic metal thin plate on the surface of the electrostatic chuck portion 2. Alternatively, the heater elements may be provided by processing and molding the heater elements 5 at a different location from the electrostatic chuck portion 2 and transfer-printing the heater elements to the surface of the electrostatic chuck portion 2.

The heater elements 5 are adhered and fixed to the bottom surface of the supporting plate 12 through an adhesive layer 4 made of a sheet-shaped or film-shaped silicon resin or acrylic resin which has a uniform thickness and has thermal resistance and insulating properties.

To the heater element 5, a terminal for power feeding 17 for feeding power to the heater element 5 is connected. As the material of the terminal for power feeding 17, it is possible to use the same material as the material constituting the above-described terminal for power feeding 15. The terminals for power feeding 17 are provided so as to penetrate through-holes 3b respectively formed in the base portion for temperature adjustment 3.

In addition, on the lower surface side of the heater element 5, a temperature sensor 20 is provided. In the electrostatic chuck device 1 of the present embodiment, installation holes 21 are formed so as to penetrate the base portion for temperature adjustment 3 and the insulating plate 7 in the thickness direction, and the temperature sensors 20 are provided in the uppermost portion of these installation holes 21. Meanwhile, the temperature sensors 20 are desirably installed at locations as close to the heater elements 5 as possible, and thus the installation holes 21 may be extended and formed so as to project more toward the adhesive layer 8 side than in the structure illustrated in the Drawing, and the temperature sensors 20 may be approximated to the heater elements 5.

The temperature sensors 20 are, for example, fluorescence emission-type temperature sensors in which a phosphor layer is formed on the upper surface side of a cuboid-shaped translucent body made of quartz glass or the like. These temperature sensors 20 are adhered to the lower surface of the heater elements 5 using a silicon resin-based adhesive or the like having translucency and thermal resistance.

The phosphor layer is made of a material that generates fluorescence in response to the input of heat from the heater element 5. The forming material of the phosphor layer may be a material that generates fluorescence in response to the generation of heat and can be selected from a variety of fluorescent materials. Examples of the forming material of the phosphor layer include fluorescent materials to which a rare earth element having an energy level suitable for light emission is added, semiconductor materials such as AlGaAs, metal oxides such as magnesium oxide, and minerals such as ruby and sapphire, and it is possible to appropriately select a material from the above-described materials and use the material.

The respective temperature sensors 20 that are provided so as to correspond to the respective heater elements 5 are respectively provided at arbitrary locations in the lower surface circumferential direction of the heater elements 5 at which no interference is caused with the terminals for power feeding.

A temperature measurement portion 22 that measures the temperature of the heater element 5 on the basis of fluorescence from the temperature sensor 20 is constituted of, for example, an excitation portion 23 on the outside (lower side) of the installation hole 21 in the base portion for temperature adjustment 3 which radiates excitation light to the phosphor layer, a fluorescent detector 24 that detects fluorescence emitted from the phosphor layer, and a control portion 25 that controls the excitation portion 23 and the fluorescent detector 24 and computes the temperatures of main heaters on the basis of the fluorescence.

Furthermore, the electrostatic chuck device 1 has a pin insertion hole 28 provided so as to penetrate the base portion for temperature adjustment 3 and the loading plate 11 in the thickness direction thereof. Into this pin insertion hole 28, a lift pin for plate-shaped sample separation is inserted. In the inner circumferential portion of the pin insertion hole 28, a tubular insulator 29 is provided.

Furthermore, the electrostatic chuck device 1 has a gas hole (not illustrated) provided so as to penetrate from the base portion for temperature adjustment 3 and the loading plate 11 in the thickness direction thereof. For the gas hole, it is possible to employ the same constitution as the pin insertion hole 28. To the gas hole, cooling gas for cooling the plate-shaped sample W is supplied. The cooling gas is supplied to grooves 19 formed among a plurality of protrusion portions 11b on the upper surface of the loading plate 11 through the gas hole and cools the plate-shaped sample W.

The electrostatic chuck device 1 forms the above-described constitution.

[Focus Ring]

Next, the focus ring 10 of the present embodiment will be described in detail.

The focus ring 10 is constituted of a material including a silicon carbide sintered body. In addition, the sintered body constituting the focus ring 10 includes a plurality of first crystal grains which has a 4H-type, 6H-type, or other-type hexagonal system and has a wurtzite-type crystal structure and a plurality of second crystal grains which has a β-SiC-type crystal structure. In the present specification, the hexagonal-system crystal structure of silicon carbide will be referred to as "α-SiC".

The sintered body constituting the focus ring 10 includes 70% by volume or more of the first crystal grains with respect to the total of the first crystal grains and the second crystal grains, and the volume-average crystallite diameter of the first crystal grains is 10 μm or less.

In addition, in the focus ring 10, the volume-average crystallite diameter of the second crystal grains is preferably smaller than the volume-average crystallite diameter of the first crystal grains.

In addition, the average volume intrinsic resistance of the sintered body constituting the focus ring 10 is 0.1 Ω·cm or more and 100 Ω·cm or less, and the fluctuation of the resistance in the focus ring is preferably less than 10 when represented by a value obtained by dividing the maximum value of the resistance by the minimum value of the resistance (the maximum value of the resistance/the minimum value of the resistance).

In addition, the ratio of the mass of impurities to the mass of the entire focus ring 10 is preferably 500 ppm or less.

The reason for constituting the focus ring 10 with the silicon carbide sintered body is as described below.

The corrosion resistance of SiC depends on the crystal structure (crystal system) of SiC. Between the above-described two kinds of crystal systems (α-SiC and β-SiC), α-SiC has higher corrosion resistance to fluorine-based gas and oxygen gas plasma (plasma resistance). Therefore, in a case in which the electrostatic chuck device is used in dry etching steps in which fluorine-based gas and oxygen gas plasma is used, α-SiC is preferably used as the forming material of the focus ring 10 since product service lives extend. On the other hand, α-SiC has poorer electrical conduction properties (has a higher resistance) than β-SiC.

Meanwhile, SiC produced using a CVD method is β-SiC. Therefore, SiC produced using a CVD method has poorer plasma resistance and higher electrical conduction properties than α-SiC as described above.

In contrast, for the silicon carbide sintered body, when α-SiC powder is used as raw material powder before sintering, silicon carbide sintered bodies including α-SiC can be easily obtained. In addition, the silicon carbide sintered body can be produced at lower costs compared with CVD. Furthermore, when α-SiC powder and β-SiC powder are used as raw material powders, and the mixing ratio between both powders is adjusted, the ratio between α-SiC powder and β-SiC powder included in the silicon carbide sintered body can be adjusted. Therefore, it is possible to adjust the resistance of the silicon carbide sintered body.

The focus ring is a member that is used to uniform the plasma state in the outer circumferential portion of a wafer which is an etching-treated substance. Therefore, the resistance of the focus ring is preferably the same as the resistance of the wafer. This is because, in a case in which there is a difference in resistance between the focus ring and a silicon wafer, the uniformity of plasma in the outer circumferential portion of the silicon wafer is adversely affected, and discharging is caused between the focus ring and the wafer.

Therefore, in the sintered body constituting the focus ring 10 of the present embodiment, the content of α-SiC is set to 70% by volume or more of the total of the first crystal grains (α-SiC) and the second crystal grains (β-SiC). In the sintered body constituting the focus ring 10, the fraction of α-SiC in the total of α-SiC and β-SiC is preferably 80% by volume or more and more preferably 90% by volume or more, and the upper limit is 99% by volume.

Meanwhile, when the content rate of the first crystal grains is less than 70% by volume, the plasma resistance of the sintered body degrades, and the etching rate of the sintered body increases, which is not preferable.

In addition, the resistance and the plasma resistance of the sintered body are taken into account, the average volume intrinsic resistance of the sintered body constituting the focus ring 10 is preferably 0.1 Ω·cm or more and 100 Ω·cm or less, more preferably 0.5 Ω·cm or more and 100 Ω·cm or less which is substantially the same resistance of silicon, and still more preferably 1 Ω·cm or more and 50 Ω·cm or less. When the average volume intrinsic resistance of the sintered body exceeds 100 Ω·cm or less, the variation of the etching rate of the sintered body increases. When electrostatic chuck devices that are used in film-forming steps include focus rings for which the above-described sintered body is used as a raw material, the variation of the film thicknesses of films that are obtained in the film-forming steps increases, which is not preferable. In addition, when the average volume intrinsic resistance of the sintered body is less than 0.1 Ω·cm, the resistance is too low, and thus charges do not easily accumulate. When focus rings for which the above-described sintered body is used as a raw material are used in electrostatic chuck devices, etching rates decrease, which is not preferable.

In addition, the reason for setting the volume-average crystallite diameter of the first crystal grains to 10 μm or less in the focus ring 10 is as described below.

α-SiC is superior to β-SiC in terms of plasma resistance, but etching rates vary depending on crystal orientations. Therefore, in focus rings including the first crystal grains, when the surfaces are exposed to plasma after the use of the focus rings, there is a tendency that surface roughness increases. The above-described surface roughness causes the generation of particles due to abnormal discharging caused by the electric field concentration of plasma or the threshing of the crystal grains.

In addition, the surface roughness that changes due to the use of the focus ring has an influence on the crystallite diameters of the crystal grains constituting the sintered body. Therefore, when the volume-average crystallite diameter of the first crystal grains is set to 10 μm or less and preferably set to 1 μm or more and 5 μm or less, it is possible to alleviate the generation of particles due to abnormal discharging or the threshing of the crystal grains.

In addition, the reason for setting the volume-average crystallite diameter of the second crystal grains to smaller than the volume-average crystallite diameter of the first crystal grains and preferably setting the volume-average crystallite diameter of the second crystal grains to ½ or less of the volume-average crystallite diameter of the first crystal grains is as described below.

β-SiC is inferior to α-SiC in terms of plasma resistance. Therefore, in the focus ring 10, it is preferable to obtain the target resistance of the focus ring while decreasing the content of the second crystal grains as much as possible in order to suppress the degradation of the plasma resistance.

When the abundance ratio of the second crystal grains is increased in order to decrease the resistance of the focus ring, the plasma resistance degrades. However, when the particle diameters of the second crystal grains are small, the second crystal grains are dispersed throughout the entire focus ring even when the content of the second crystal grains is small. Therefore, in focus rings including a small amount of the second crystal grains having a small particle diameter, it becomes easy to ensure electrical conduction properties, and it becomes easy to obtain focus rings having a predetermined resistance even when the ratio of the first crystal grains is 70% by volume or more.

The reason for setting the ratio of the mass of impurities to the mass of the entire focus ring 10 (the content rate of impurities) to 500 ppm or less is as described below.

In etching steps, the focus ring itself is etched. During the production of the sintered body constituting the focus ring, there is a case in which a compound including B, Al, Y, Be, and the like is used as a sintering assistant (a compound including impurity elements that are elements other than silicon and carbon). In this case, the elements other than silicon and carbon (the impurity elements) in the sintering assistant also remain in the sintered body (focus ring). Therefore, when the focus ring itself is etched in etching steps, there is a concern that the impurity elements derived from the sintering assistant may be discharged from the focus ring and adversely affect the characteristics of products that are produced in the etching steps (for example, semiconductors).

In addition, the defect of SiC caused by these impurities causes the degradation of resistance and thermal conduction properties in high-temperature environments during plasma irradiation and causes the generation of a temperature distribution (temperature differences between portions in the focus ring) in the focus ring.

In contrast, when the content rate of the impurities to the mass of the entire focus ring 10 is set to 500 ppm or less, it is possible to suppress these expected disadvantages.

The focus ring 10 is heated by the exposure to plasma and self-generated heat by high frequencies. In a case in which a temperature distribution is generated in the heated focus ring, thermal expansion amounts vary depending on portions in the focus ring, and there is a concern that distortion may be caused in the focus ring. In this case, the contact state between a cooling base and the focus ring changes between before heating and after heating. Therefore, the thermal conduction amount between the focus ring and the cooling base changes, and the temperature difference in the focus ring further expands.

Therefore, the thermal conductivity of the focus ring 10 is preferably 100 W/mK or more and more preferably 150 W/mK or more. In such a case, the generation of the temperature difference in the focus ring 10 is suppressed, and the deformation of the focus ring 10 can be suppressed.

Meanwhile, in the focus ring 10, when the thermal conductivities in the circumferential direction and in the radial direction are greater than the thermal conductivity in the thickness direction, it is easy to control the temperature distribution of the focus ring 10, which is more preferable.

The reason for setting the relative density (the ratio of the actually-measured density to the theoretical density of SiC) of the sintered body constituting the focus ring 10 to 95% or more is as described below.

In a case in which the density of the sintered body is 95% or less, the plasma resistance deteriorates, and particles are generated, which is not preferable. In addition, the thermal conductivity also decreases, and temperature variation is caused.

Meanwhile, in the present embodiment, as the average volume intrinsic resistance of the sintered body which is the forming material of the focus ring 10, a value obtained by measuring the resistance of a measurement subject (the sintered body or the focus ring) using the four probe method (measurement instrument: LORESTA GP MCP-T610, manufactured by Mitsubishi Chemical Analytech Co., Ltd.) and computing the volume intrinsic resistance from the shape and thickness of a test specimen is employed.

In addition, in the present embodiment, as the content rate of the impurities, a value measured using the ICP-MS method is employed.

In addition, in the present embodiment, regarding the ratio of the first crystal grains to the total of the first crystal grains and the second crystal grains in the sintered body which is the forming material of the focus ring 10, first, XRD measurement is carried out on the sintered body, the respective peak intensities (peak areas) of the first crystal grains ($\alpha$-SiC-type crystals) and the second crystal grains ($\beta$-SiC-type crystals) are obtained, and then the ratio of the peak intensity of the first crystal grains to the total of the peak intensity of the first crystal grains and the peak intensity of the second crystal grains is employed as the volume ratio of the first crystal grains in the sintered body.

In addition, in the present embodiment, as the thermal conductivity, a value measured using the laser flash method is employed.

The focus ring 10 of the present embodiment forms the above-described constitution.

[Method for Producing Focus Ring]

A method for producing a focus ring according to the present embodiment includes a step of mixing first particles which have an average particle diameter of 5 µm or less and an $\alpha$-SiC-type crystal structure and second particles which have a $\beta$-SiC-type crystal structure and an average particle diameter of 0.1 µm or less so that the content of the first particles reaches 70% by volume or more of the total of the first particles and the second particles and a step of sintering the obtained mixed particles using a hot press.

In addition, in the step of sintering, the mixture is heated and pressurized at a temperature of 2,200° C. or higher and 2,500° C. or lower and a pressure of 20 MPa or more and 50 MPa or less, and the heating temperature-rise rate from 1,400° C. to 2,000° C. is 10° C./minute or more and 30° C./minute or less.

In the step of mixing, it is preferable to mix the first particles and the second particles together in a predetermined formula, disperse the obtained mixed particles in a dispersion medium so as to produce a dispersion liquid, then, spray the dispersion liquid at a high pressure in two facing directions using a two-stream collision-type mixing apparatus, cause the particles to collide with each other so as to mix and disperse the particles, and dry and granulate the particles, thereby producing mixed powder.

In addition, in the step of mixing, it is preferable that the sintering assistant is further mixed therewith and the ratio of the mass of the impurity elements in the sintering assistant to the mass of the entire mixed particles is 500 ppm or less. When the content of the impurities exceeds 500 ppm, the impurities come out from the consumed focus ring, and the wafer surfaces are contaminated, which is not preferable.

In the present embodiment, as the particle diameters of the first particles and the second particles, the value of d(50) obtained by preparing a slurry including the respective powders dispersed in a solvent and measuring the slurry using a laser diffraction/scattering-type particle size distribution measuring device (MASTERSIZER 2000S, manufactured by Malvern Instruments Ltd.) is employed.

In the method for producing a focus ring of the present embodiment, the reason for mixing the first particles which have an $\alpha$-SiC-type crystal structure and the second particles which have a $\beta$-SiC-type crystal structure and an average particle diameter of 0.1 µm or less so that the content of the first particles reaches 70% by volume or more of the total of the first particles and the second particles is as described below.

In the above-described production method, the plasma resistance or the average volume intrinsic resistance of the sintered body and the focus ring that is obtained by processing the sintered body can be controlled by controlling the mixing ratio between the first particles and the second particles or the respective particle diameters of the first particles and the second particles.

That is, when the amount of the first particles is increased, in focus rings to be obtained, the resistance to plasma for which fluorine-based gas and oxygen gas are used as raw material gases improves, and the average volume intrinsic resistance increases.

In addition, in a case in which the amount of $\beta$-SiC in the focus ring is constant, when the particle diameters of the second particles become small, the average volume intrinsic resistance of focus rings to be obtained decreases. Therefore, the average particle diameter of the second particles is preferably smaller than the average particle diameter of the first particles.

Furthermore, when the particle diameter of $\beta$-SiC having poorer resistance to plasma for which fluorine-based gas and oxygen gas are used as raw material gases than $\alpha$-SiC is decreased, it is possible to suppress an increase in the surface roughness of the focus ring caused by etching and suppress the generation of particles.

In addition, when particles synthesized using a thermal plasma CVD method are used as the second particles, it is possible to obtain dense sintered bodies even without using the sintering assistant. Therefore, it is possible to produce high-purity focus rings having a dense and fine crystal structure.

In addition, in the step of mixing, it is preferable to mix the first particles and the second particles by pressuring the particles respectively using a two-stream particle collision-type crushing and mixing apparatus so as to be sprayed at a high speed and be caused to collide with each other.

In the collision between the first particles and the second particles, larger particles have a larger kinetic energy during collision and are easily crushed. On the other hand, smaller particles have a smaller kinetic energy during collision and are not easily crushed. Therefore, it is possible to obtain powder which includes a small amount of coarse particles or over-crushed particles and has a narrow particle size distribution width. Therefore, when mixtures obtained by crushing and mixing the particles using a two-stream particle collision-type crushing and mixing apparatus are used, in the step of sintering, it is possible to suppress abnormal grain growth in which coarse particles serve as nuclei.

In addition, in the present crushing and mixing method, α-SiC particles having a large particle diameter are selectively crushed, and the degree of crushing can be easily adjusted using the particle diameter collision rate (spraying pressure), and thus it is possible to alleviate the influence of the variation of the initial particle size distribution between the lots of α-SiC and suppress the fluctuation of the structure and resistance of the sintered body caused by the difference in particle size distribution between the lots.

Furthermore, in the present method, raw material powder particles themselves are caused to collide with each other, it is possible to suppress the infusion of impurities from containers such as a ball mill and balls.

In addition, the reason for heating and pressurizing the mixture at a temperature of 2,200° C. or higher and 2,500° C. or lower and a pressure of 20 MPa or more and 50 MPa or less and setting the heating temperature-rise rate from 1,400° C. to 2,000° C. to 10° C./minute or more and 30° C./minute or less in the step of sintering is as described below.

At temperatures of lower than 2,200° C., sufficient sintering densities cannot be obtained, and, at temperatures of higher than 2,500° C., the grain growth of SiC is caused, which is not preferable.

In addition, the reason for setting the sintering pressure to 20 MPa or more and 50 MPa or less is that, at pressures of less than 20 MPa, sufficient densities cannot be obtained, and, at pressures of more than 50 MPa, there is a concern that jigs used to carry out hot press may break or deform.

In addition, the reason for setting the temperature-rise rate from 1, 400° C. to 2,000° C. to 10° C./minute or more and 30° C./minute or less is that, at temperature-rise rates of less than 10° C./minute, only the grain growth of SiC proceeds, and dense sintered bodies cannot be obtained, and, in the case of temperature-rise rates of more than 30° C./minute, a significant amount of electrical power is required, the internal consumption of focus ring-producing apparatuses becomes significant and fast, and furthermore, temperature distributions are generated in the apparatuses, and thus the variation of the in-plane resistance of the focus ring is caused.

The method for producing a focus ring of the present embodiment is as described above.

According to the focus ring 10 having the above-described constitution, it is possible to provide a focus ring having favorable plasma resistance.

In addition, according to the method for producing a focus ring having the above-described constitution, it is possible to provide a method for producing a focus ring which enables the easy production of focus rings having favorable plasma resistance.

Hitherto, preferred embodiment examples according to the present invention have been described with reference to the accompanying drawing, but it is needless to say that the present invention is not limited to such examples. A variety of shapes, combinations, and the like of the respective constituent members described in the above-described examples are simple examples and can be modified in diverse manners on the basis of design requirements and the like within the scope of the main purport of the present invention.

EXAMPLES

Hereinafter, the present invention will be described using examples, but the present invention is not limited to these examples.

In the following examples, test specimens were produced using sintered bodies which were forming materials of focus rings, model experiments for evaluating the plasma resistance of the test specimens were carried out, and the effects of the present invention were confirmed.

Example 1

α-SiC powder having an average particle diameter of 0.8 μm and β-SiC powder having an average particle diameter of 0.05 μm (thermal plasma CVD powder) were preliminarily mixed together in an α-SiC powder to β-SiC powder mass ratio of 10:1 and were then dispersed in water, thereby producing a dispersion liquid.

Next, the obtained dispersion liquid was crushed and mixed using a two-stream particle collision-type crushing and mixing apparatus, and was then granulated and dried by means of spray drying, thereby obtaining mixed powder of the α-SiC powder and the β-SiC powder.

Next, the obtained mixed powder was molded and was sintered under conditions of a temperature of 2,400° C. and a pressure of 40 MPa in an argon atmosphere for four hours, thereby obtaining a sintered body having φ370 mm. Meanwhile, the temperature-rise rate from 1,400° C. to 2,000° C. during the sintering was set to 15° C./minute.

The outer circumference and both surfaces of the obtained sintered body were ground, and the density and the resistance distribution were measured. In addition, a test specimen was cut out from the sintered body, and the volume ratio (a ratio) of α-SiC-type crystal grains in the sintered body, the average particle diameter of the α-SiC-type crystal grains, and the thermal conductivity of the sintered body were measured using the test specimen.

In addition, the etching rates in oxygen+fluorine-based plasma and chlorine-based plasma were compared with one another. The results are shown in Table 1.

In addition, the central portion and the outer circumferential portion of the sintered body having φ370 mm were ground, thereby producing a focus ring having an inner diameter φ of 298 mm, an outer diameter φ of 345 mm, and a thickness of 4 mm. The obtained focus ring was installed in an electrostatic chuck device, and an etching treatment was carried out on a silicon wafer.

Meanwhile, the thermal conductivity was measured using the laser flash method in which a φ10 mm×1 mm-thick sample was used.

The α ratio of the sintered body was computed from a peak ratio obtained by the XRD measurement of one surface of the sintered body.

The average particle diameter was obtained by grinding and etching the sintered body, then, capturing a SEM photograph of one surface of the sintered body, separating every crystal grain from the obtained SEM photograph by means of image processing, then, obtaining the arithmetic average values of the respective crystal grains in the long direction and in the short direction as the particle diameters, obtaining the crystallite diameters of a minimum of 50 crystal grains, and obtaining the average crystallite diameter by means of arithmetic averaging.

The average volume intrinsic resistance of the measurement subject (the sintered body or the focus ring) was measured using the four probe method (measurement instrument: LORESTA GP MCP-T610, manufactured by Mitsubishi Chemical Analytech Co., Ltd.), and the volume intrinsic resistance was computed from the shape and thickness of the test specimen.

Example 2

A sintered body of Example 2 was obtained in the same manner as in Example 1 except for the fact that the mixing ratio of the α-SiC powder to the β-SiC powder was set to 10:3 (the α-SiC powder:the β-SiC powder) in terms of the mass ratio.

The obtained sintered body was measured on the basis of Example 1. The test results are shown in Table 1.

Example 3

A sintered body of Example 3 was obtained in the same manner as in Example 1 except for the fact that the β-SiC powder was not used and only the α-SiC powder was used.

The obtained sintered body was measured on the basis of Example 1. The test results are shown in Table 1.

Example 4

A sintered body of Example 4 was obtained in the same manner as in Example 1 except for the fact that the mixing ratio of the α-SiC powder to the β-SiC powder was set to 10:2 (the α-SiC powder:the β-SiC powder) in terms of the mass ratio and the sintering temperature was set to 2,500° C.

The obtained sintered body was measured on the basis of Example 1. The test results are shown in Table 1.

Example 5

A sintered body of Example 5 was obtained in the same manner as in Example 1 except for the fact that, as the β-SiC powder, β-SiC powder having an average particle diameter of 0.8 μm, which was obtained using a silica reduction method, was used.

The obtained sintered body was measured on the basis of Example 1. The test results are shown in Table 1.

Example 6

A sintered body of Example 6 was obtained in the same manner as in Example 1 except for the fact that the mixing ratio of the α-SiC powder to the β-SiC powder was set to 10:0.5 (the α-SiC powder:the β-SiC powder) in terms of the mass ratio.

The obtained sintered body was measured on the basis of Example 1. The test results are shown in Table 1.

Example 7

A sintered body of Example 7 was obtained in the same manner as in Example 1 except for the fact that the mixing ratio of the α-SiC powder to the β-SiC powder was set to 10:3 (the α-SiC powder:the β-SiC powder) in terms of the mass ratio and the sintering temperature was set to 2,500° C.

The obtained sintered body was measured on the basis of Example 1. The test results are shown in Table 1.

Comparative Example 1

A sintered body of Comparative Example 1 was obtained in the same manner as in Example 1 except for the fact that 0.8 μm β-SiC powder was used instead of the α-SiC powder.

The obtained sintered body was measured on the basis of Example 1. The test results are shown in Table 1.

Comparative Example 2

A sintered body of Comparative Example 2 was obtained in the same manner as in Example 1 except for the fact that the mixing ratio of the α-SiC powder to the β-SiC powder was set to 10:10 (the α-SiC powder:the β-SiC powder) in terms of the mass ratio.

The obtained sintered body was measured on the basis of Example 1. The test results are shown in Table 1.

Comparative Example 3

A sintered body of Comparative Example 3 was obtained in the same manner as in Example 1 except for the fact that α-SiC powder having an average particle diameter of 5 μm was used as the α-SiC powder and the mixing ratio of the α-SiC powder to the β-SiC powder was set to 10:1 (the α-SiC powder:the β-SiC powder) in terms of the mass ratio.

The obtained sintered body was measured on the basis of Example 1. The test results are shown in Table 1.

Comparative Example 4

A sintered body of Comparative Example 4 was obtained in the same manner as in Example 1 except for the fact that the α-SiC powder was not used and only the β-SiC powder was used.

The obtained sintered body was measured on the basis of Example 1. The test results are shown in Table 1.

Reference Examples 1 and 2

As a reference sample for plasma resistance, a test specimen was produced from a silicon ingot, and the comparison of the plasma resistance was carried out (Reference Example 1).

In addition, a test specimen was produced from a SiC-CVD ingot (an ingot obtained by depositing SiC using a CVD method), and the comparison of the plasma resistance was carried out (Reference Example 2).

In the present example, the test specimens were exposed to two kinds of plasma under the following conditions so as to be etched, and the etching rates were measured, thereby confirming the plasma resistance.

(Chlorine-Based Plasma)
High-frequency power source (output): 70 W
High-frequency power source (frequency): 13.56 MHz
Self bias (Vdc): −300 V
Pressure: 20 mTorr (2.666 Pa)
Etching gas flow rate (chlorine): 10 sccm
Carrier gas flow rate (Ar): 90 sccm
(Fluorine+Oxygen-Based Plasma)
High-frequency power source (output): 70 W
High-frequency power source (frequency): 13.56 MHz
Self bias (Vdc): −300 V
Pressure: 20 mTorr (2.666 Pa)
Etching gas flow rate ($CF_4$): 10 sccm
Etching gas flow rate ($O_2$): 10 sccm
Carrier gas flow rate (Ar): 90 sccm The compositions and sintering temperatures of the sintered bodies of the examples and the comparative examples are shown in Table 1. The results of the etchings using the fluorine+oxygen-based plasma and the chlorine-based plasma are shown in Table 2.

TABLE 1

| | Raw material blending ratio | | | | Sintering temperature (° C.) |
|---|---|---|---|---|---|
| | α-SiC powder | | β-SiC powder | | |
| | 0.8 μm | 5 μm | 0.05 μm | 0.8 μm | |
| Example 1 | 10 | — | 1 | — | 2400 |
| Example 2 | | | 3 | | |
| Example 3 | | | 0 | | |
| Example 4 | | | 2 | | 2500 |
| Example 5 | | | — | 1 | 2400 |
| Example 6 | | | 0.5 | | |
| Example 7 | | | 3 | | 2500 |
| Comparative Example 1 | — | | 1 | 10 | 2400 |
| Comparative Example 2 | 10 | | 10 | — | |
| Comparative Example 3 | — | 10 | 1 | | |
| Comparative Example 4 | 0 | — | 10 | | |

TABLE 2

| | Relative density | | α ratio | Particle diameter | Volume resistance | Thermal conductivity | Etching rate (μm/hour) | |
|---|---|---|---|---|---|---|---|---|
| | g/cm³ | % | % | μm | Ω · cm | W/mk | Fluorine + oxygen | Chlorine |
| Example 1 | 3.19 | 99 | 90 | 1.5 | 35 | 250 | 2.5 | 1.5 |
| Example 2 | 3.19 | 99 | 75 | 1.8 | 2 | 200 | 2.0 | 1.3 |
| Example 3 | 3.10 | 96 | 100 | 1.5 | 10 | 240 | 0.3 | 1.8 |
| Example 4 | 3.05 | 95 | 90 | 8.5 | 0.5 | 170 | 2.7 | 1.5 |
| Example 5 | 3.03 | 94 | 95 | 2.7 | 350 | 190 | 2.5 | 1.7 |
| Example 6 | 3.19 | 99 | 100 | 2.0 | 90 | 250 | 0.3 | 1.6 |
| Example 7 | 3.05 | 95 | 90 | 5.0 | 1 | 230 | 2.6 | 1.4 |
| Comparative Example 1 | 3.19 | 99 | 51 | 1.5 | 0.01 | 210 | 4.5 | 1.3 |
| Comparative Example 2 | 3.19 | 99 | 65 | 1.7 | 0.2 | 240 | 3.0 | 1.3 |
| Comparative Example 3 | 2.95 | 92 | 90 | 15.0 | 200 | 150 | 3.5 | 1.5 |
| Comparative Example 4 | 3.19 | 99 | 44 | 1.5 | 0.01 | 200 | 5.0 | 1.2 |
| Reference Example 1 | — | — | — | — | — | 168 | 2.0 | 3.5 |
| Reference Example 2 | 3.21 | 100 | — | — | 100 | 250 | 4.5 | 1.2 |

As a result of the evaluations, for the sintered bodies of Examples 1 to 7, the etching rates by the fluorine+oxygen-based plasma were less than 3 μm/hour, but the etching rates of the sintered bodies of Comparative Examples 1 to 4 and Reference Example 2 (SiC CVD) were 3 μm/hour or more. Therefore, it was found that the sintered bodies of Examples 1 to 7 has more favorable plasma resistance to the fluorine+oxygen-based plasma than the sintered bodies of Comparative Examples 1 to 4 and Reference Example 2.

In addition, it was found that the test specimens of Examples 1 to 7 has a smaller etching rate by the chlorine-based plasma than the test specimen of Reference Example 1 (Si).

INDUSTRIAL APPLICABILITY

Hitherto, it has been confirmed that the present invention has favorable plasma resistance and is useful as a focus ring.

REFERENCE SIGNS LIST 1 electrostatic chuck device
2 electrostatic chuck portion
3 base portion for temperature adjustment
3A flow path
3b through-hole
4 adhesive layer
5 heater element
6 adhesive layer
7 insulating plate
8 adhesive layer
W plate-shaped sample
10 focus ring
11 loading plate
11a loading surface
11b protrusion portion
12 supporting plate
13 electrode for electrostatic adsorption
14 insulating material layer
15 terminal for power feeding
15a insulator
16 through-hole
17 terminal for power feeding
20 temperature sensor
21 installation hole
22 temperature measurement portion
23 excitation portion
24 fluorescent detector
25 control portion
28 pin insertion hole
29 insulator

The invention claimed is:

1. A focus ring comprising:
    a sintered body of silicon carbide, the sintered body including a plurality of first crystal grains having an α-SiC-type crystal structure and a plurality of second crystal grains having a β-SiC-type crystal structure, in which
    a content of the first crystal grains is 70% by volume or more of a total of the first crystal grains and the second crystal grains, and
    a volume-average crystallite diameter of the first crystal grains is 10 μm or less.

2. The focus ring according to claim 1,
wherein a volume-average crystallite diameter of the second crystal grains is smaller than the volume-average crystallite diameter of the first crystal grains.

3. The focus ring according to claim 1,
wherein an average volume intrinsic resistance of the sintered body is 0.1 Ω·cm or more and 100 Ω·cm or less.

4. The focus ring according to claim 1,
wherein a thermal conductivity of the focus ring is 100 W/mK or more, and
thermal conductivities of the focus ring in a circumferential direction and in a radial direction are greater than a thermal conductivity in a thickness direction.

5. The focus ring according to claim 1,
wherein a relative density of the sintered body is 95% or more.

6. The focus ring according to claim 1,
wherein a ratio of a mass of impurities in the sintered body to a mass of the entire focus ring is 500 ppm or less.

7. A method for producing a focus ring, the method comprising:
mixing first particles which have an α-SiC-type crystal structure and an average particle diameter of 5 μm or less and second particles which have a β-SiC-type crystal structure and an average particle diameter of 0.1 μm or less so that a content of the first particles reaches 70% by volume or more of a total of the first particles and the second particles; and
sintering a mixture including mixed particles of the first particles and the second particles using a hot press,
wherein, in the sintering, the mixture is heated and pressurized at 2,200° C. or higher and 2,500° C. or lower and 20 MPa or more and 50 MPa or less, and a heating temperature-rise rate from 1,400° C. to 2,000° C. is 10° C./minute or more and 30° C./minute or less.

8. The method for producing a focus ring according to claim 7, further comprising, prior to the mixing:
synthesizing the second particles using a thermal plasma CVD method.

9. The method for producing a focus ring according to claim 7,
wherein, in the mixing, the first particles and the second particles are respectively sprayed at a high speed and caused to collide with each other.

10. The method for producing a focus ring according to claim 7,
wherein, in the mixing, a compound including impurity elements which are elements other than silicon and carbon is further mixed thereinto, and a ratio of a mass of the impurity elements to a mass of the entire mixed particles is 500 ppm or less.

* * * * *